United States Patent
Ku et al.

(10) Patent No.: US 8,803,544 B2
(45) Date of Patent: Aug. 12, 2014

(54) INTEGRATED CIRCUIT CHIP AND TESTING METHOD CAPABLE OF DETECTING CONNECTION ERROR

(75) Inventors: Chih-Cheng Ku, Hsinchu (TW); Shan-Cheng Sun, Hsinchu (TW); You-Kuo Wu, New Taipei (TW)

(73) Assignee: MStar Semiconductor, Inc., Hsinchu (TW)

(*) Notice: Subject to any disclaimer, the term of this patent is extended or adjusted under 35 U.S.C. 154(b) by 438 days.

(21) Appl. No.: 13/279,390

(22) Filed: Oct. 24, 2011

(65) Prior Publication Data

US 2012/0280708 A1 Nov. 8, 2012

(30) Foreign Application Priority Data

May 5, 2011 (TW) .............................. 100115744 A

(51) Int. Cl.
*G01R 31/26* (2014.01)
*G01R 31/28* (2006.01)

(52) U.S. Cl.
CPC .................................. *G01R 31/2884* (2013.01)
USPC .................................. 324/762.03; 324/762.01

(58) Field of Classification Search
CPC ........... G01R 31/3012; G01R 31/2884; G01R 31/2642; G01R 31/26; G01R 31/2832; G01R 31/2853; G01R 31/3008; G01R 31/31715
See application file for complete search history.

(56) References Cited

U.S. PATENT DOCUMENTS

| 6,298,001 B1 | 10/2001 | Lee et al. |
| 6,784,685 B2 * | 8/2004 | Chao et al. ............... 324/754.05 |
| 7,724,023 B1 | 5/2010 | Fratti et al. |
| 7,977,962 B2 * | 7/2011 | Hargan et al. ............ 324/762.01 |
| 2007/0058449 A1 * | 3/2007 | Choi ........................ 365/189.01 |
| 2010/0123483 A1 | 5/2010 | Chung et al. |

FOREIGN PATENT DOCUMENTS

| CN | 101738579 | 6/2010 |
| JP | 2010261931 | 11/2010 |
| TW | 1287096 | 9/2007 |

* cited by examiner

*Primary Examiner* — Vinh Nguyen
(74) *Attorney, Agent, or Firm* — WPAT, PC; Justin King

(57) ABSTRACT

An integrated circuit chip is provided. The integrated circuit chip includes a pad, a first resistor, a second resistor, a first switch, a second switch and a controller. The first resistor and the first switch are serially connected between the pad and a first reference voltage terminal. The second resistor and the second switch are serially connected between the pad and a second reference voltage terminal. The controller selectively turns on and off the first and second switches according to an error determining mechanism. The error determining mechanism determines whether an error condition associated with the pad is present.

16 Claims, 3 Drawing Sheets

|  | first switch | second switch | test result |
|---|---|---|---|
| pad is normal | on | off | V1 is high level |
|  | off | on | V2 is low level |

|  | first switch | second switch | test result |
|---|---|---|---|
| No error and external voltage is high level | on | off | V1 and V2 are high level |
|  | off | on | |
| No error and external voltage is low level | on | off | V1 and V2 are low level |
|  | off | on | |
| Error is present | on | off | V1 is high level; V2 is low level |
|  | off | on | |

INTEGRATED CIRCUIT CHIP AND TESTING METHOD CAPABLE OF DETECTING CONNECTION ERROR

FIELD OF THE INVENTION

The present invention relates to an integrated circuit, and more particularly, to a method for testing an integrated circuit.

BACKGROUND OF THE INVENTION

To reserve application flexibilities of integrated circuit chips in various conditions, many chips are designed to include one or several bonding option pads for receiving an external control voltage. By providing different control voltages to the pad via bonding wires, the chip is allowed to operate at different operating modes. Take a video processing chip as an example. By connecting a built-in bonding option pad to a power supply or ground, the chip may be set to receive video signals of different specifications. In practice, the bonding option pad may also be utilized to switch on or off specific functions in the chip for customization.

As shown in FIGS. 1A and 1B, the bonding option pad is usually fixed to an internal voltage supply or ground of the chip via a resistor R, so as to prevent the bonding option pad from entering a floating state. Take FIG. 1A as an example. A pad 10 may not correctly receive an external voltage when the pad 10 is damaged or a bonding wire 12 connecting to the pad 12 is disengaged, nevertheless, a voltage at a connecting point between the pad 10 and the internal circuit is at least maintained at a high level instead of being in the floating state. Conversely, under conditions that the pad 10, the bonding wire 12 and the external voltage supply 14 are all correctly connected, the voltage of the pad 10 is approximately equal to the voltage of the external voltage supply 14.

It is necessary that a chip manufacturer carries out various tests on a manufactured chip, and the tests generally include whether operating conditions of the bonding option pad and connections of the bonding option pad and the external voltage supply are normal. Take FIG. 1A as an example, a tester may first determine whether the pad 10 is functional before the bonding wire 12 is connected to the pad 10. After the bonding wire 12 is connected to the pad, the chip is again tested to determine whether connections between the pad 10, the bonding wire 12 and the external voltage supply 14 are correct.

With reference to FIG. 1A, before the bonding wire 12 is connected to the pad 10, the pad 10 is determined defective supposing the test staff finds that the voltage of the pad 10 is not at a high level, such that the chip is determined as a bad die. Furthermore, after connecting the pad 10 to the external voltage supply 14 via the bonding wire 12, supposing a test result indicates that the pad 10 is at a high level when in fact the external voltage supply 14 is connected to ground, it is inferred that the bonding wire 12 connected to the pad 10 is disengaged, such that the chip is also determined as a bad die.

In the absence of the resistor R, the connecting point of the internal circuit connected to the pad 10 enters the floating state when the above damages or incorrect electrical connections occur; that is, the voltage at the connecting point may either be at a high level or a low level. Take FIG. 1A as an example, an error condition cannot be reflected by a test result when the external voltage supply 14 is connected to ground and the floating point is happened to be at a low level. Therefore, the presence of the resistor R is essential.

However, when the external voltage supply 14 in FIG. 1A is connected to ground, the resistor R consumes a certain amount of power during normal operations. Similarly, the resistor R also consumes a certain amount of power during normal operations when the external voltage supply 14 in FIG. 1B is a power supply. In a field of mobile devices that highly values power lasting capabilities, the fixed power consumption brings rather significant undesirable effects.

From testing perspectives, the connections adopted in FIG. 1A and FIG. 1B cannot provide complete test correctness. Take the connection in FIG. 1A for example, under a testing mode after the bonding wire 12 is connected to the pad 10, when the external voltage supply 14 is connected to a power supply, the pad 10 remains at a high level for the resistor R is connected to an internal power supply VDD even if the bonding wire 12 is disengaged, such that the occurrence of an error condition eludes from the test result and probable issues during a welding process of the bonding wire 12 cannot be improved in time. Similarly, as shown in FIG. 1B, under the testing mode after the bonding wire 12 is connected to the pad 10, when the external voltage supply 14 is connected to ground, the pad 10 remains at a low level for the resistor R is connected to internal ground GND even if the bonding wire 12 is disengaged, such that the occurrence of an error condition also eludes from the test result.

SUMMARY OF THE INVENTION

Therefore, the object of the present invention is to provide an integrated circuit chip and test method thereof. By selectively connecting a pad to different reference voltages during a testing procedure and comparing corresponding test results, the integrated circuit chip and test method thereof are capable of effectively determining whether electrical connections associated with the pad are functional. When the chip operates at a normal operating mode, no leakage path is formed between the pad and a power supply/ground, so as to overcome fixed power consumption in the prior art.

The present invention provides an integrated circuit chip comprising a pad, a first resistor, a first switch, a second resistor, a second switch and a controller. The first resistor and the first switch are serially connected between the pad and a first reference voltage terminal. The second resistor and the second switch are serially connected between the pad and a second reference voltage terminal. The controller selectively turns on/off the first switch and the second switch according to an error determining mechanism, which determines whether an error condition associated with the pad is present.

The present invention further provides a testing method for an integrated circuit chip. The integrated circuit chip comprises a pad, a first resistor, a first switch, a second resistor, a second switch and a controller. The first resistor and the first switch are serially connected between the pad and a first reference voltage terminal. The second resistor and the second switch are serially connected between the pad and a second reference voltage terminal. The testing method comprises a measuring a testing point associated with the pad after turning on the first switch and turning off the second switch to generate a first test result, measuring the testing point again after turning on the second switch and turning off the first switch to generate a second test result, and determining whether an error condition is present according to the first test result and the second test result.

Compared to the prior art, the test method and integrated circuit chip of the present invention are advantaged by having low-power consumption and being capable of effectively confirming whether a connection error is present.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
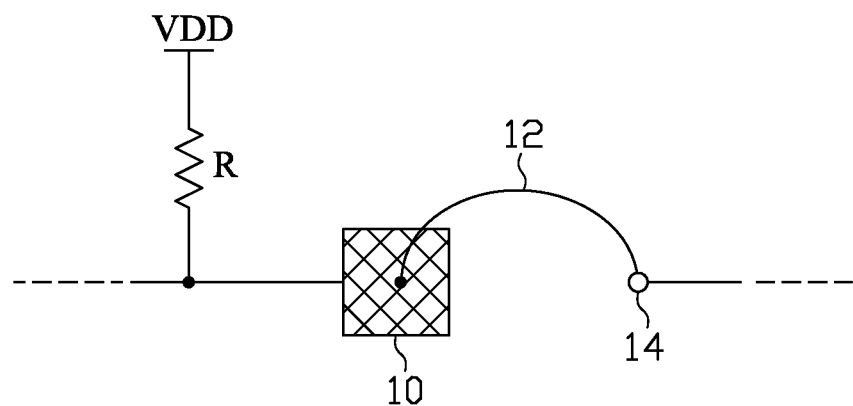
FIGS. 1A and 1B are schematic views of a connection of a pad in the prior art.
Figure 1B:
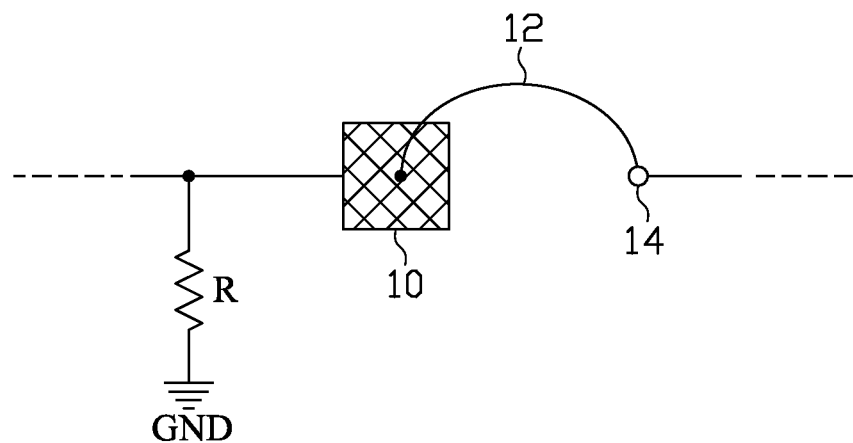
Figure 2A:
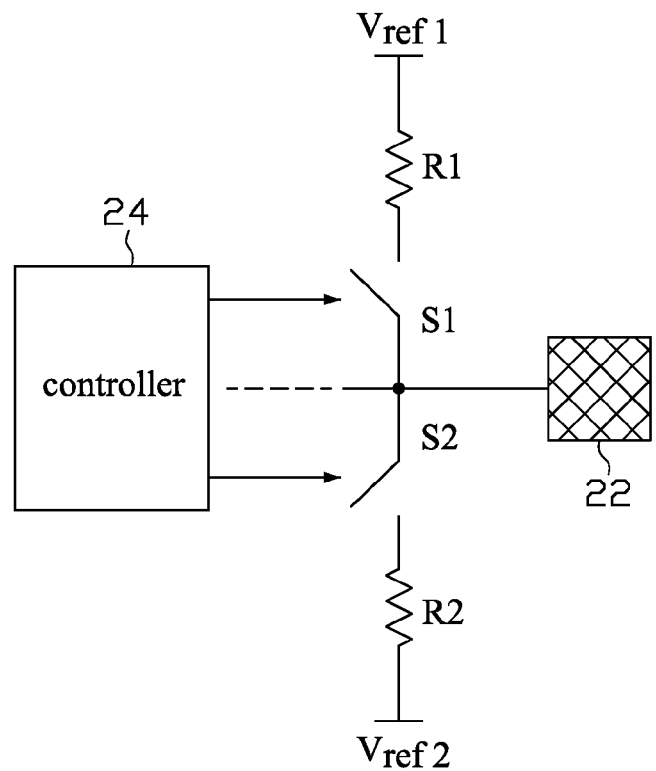
FIGS. 2A and 2B are partial schematic diagrams of an integrated circuit chip according to an embodiment of the present invention.

FIG. 2A is a partial schematic diagram of an integrated circuit chip according to an embodiment of the present invention. The integrated circuit chip comprises a pad 22, a first resistor R1, a first switch S1, a second resistor R2, a second switch S2 and a controller 24. For example, the pad 22 can be a bonding option pad.

As shown in FIG. 2A, the first resistor R1 and the first switch S1 are serially connected between the pad 22 and a first reference voltage terminal $V_{ref1}$, and the second resistor R2 and the second switch S2 are serially connected between the pad 22 and a second reference voltage terminal $V_{ref2}$. The voltage of first reference voltage terminal $V_{ref1}$ differs from the voltage of the second reference voltage terminal $V_{ref2}$. In practice, the first switch S1 and the first resistor R1 may be realized by a complementary metal oxide semiconductor (CMOS) transistor CMOS1; and the second switch S2 and the second resistor R2 may be realized by another CMOS transistor CMOS2. The first resistor R1 and the second resistor R2 are respectively an internal resistor of the CMOS transistors CMOS1 and CMOS2. Furthermore, the first reference voltage terminal $V_{ref1}$ and the second reference voltage terminal $V_{ref2}$ may be internal voltage supply ends in the integrated circuit chip. In the following example, a power supply VDD is connected to the first reference voltage terminal $V_{ref1}$ and ground GND is connected to the second reference voltage terminal $V_{ref2}$.

According to an error determining mechanism, the controller 24 selectively turns on/off the first switch S1 and the second switch S2. For example, the error determining mechanism may be a procedure for determining whether an error condition associated with the pad 22 is present during a testing procedure. In the testing procedure, the controller 24 first turns on the first switch S1 and turns off the second switch S2, such that the pad 22 is connected to the first reference voltage terminal $V_{ref1}$ via the first resistor R1. When the first switch S1 is turned on and the second switch S2 is turned off by the controller 24, a voltage of the pad 22 is measured by an external apparatus as a first voltage V1.

The controller 24 then turns on the second switch S2 and turns off the first switch S1, such that the pad 22 is connected to the second reference voltage terminal $V_{ref1}$ via the second resistor R2. When the second switch S2 is turned on and the first switch S1 is turned off by the controller 24, the voltage of the pad 22 is again measured as a second voltage V2.

A testing procedure before the pad 22 is connected to an external voltage supply via a bonding wire is to be discussed.

Supposing the first voltage V1 and the power supply VDD are equipotential (i.e., voltages of the pad 22 and the first reference voltage terminal $V_{ref1}$ are approximately the same) and the second voltage V2 and ground GND are equipotential (i.e., voltages of the pad 22 and the second reference voltage terminal $V_{ref2}$ are approximately the same), it means that the pad 22 is functioning properly, and the error condition is determined not present.

Figures 3A, 3B, 4:
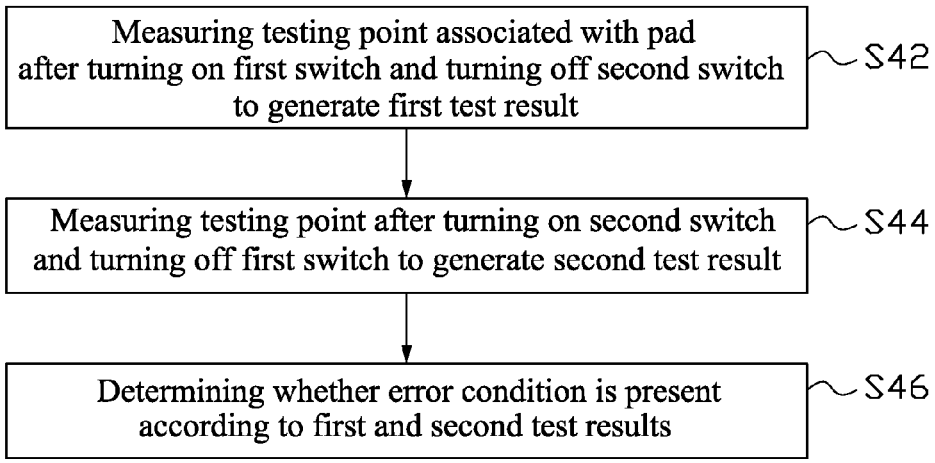
FIGS. 3A and 3B are lists of test conditions and test results.
FIG. 4 is a flowchart of a test method applied to an integrated circuit board according to an embodiment of the present invention.

Referring to a table in FIG. 3A, under normal functioning of the pad 22, the first voltage V1 measured when the first switch S1 is turned on and the second switch S2 is turned off is supposed to be a high level, and the second voltage V2 measured when the first switch S1 is turned off and the second switch S2 is turned on is supposed to be a low level. In other words, when a test result differs from the table in FIG. 3A, it means that the pad 22 is incapable of normal functions, i.e., the pad 22 is damaged.

Figure 2B:
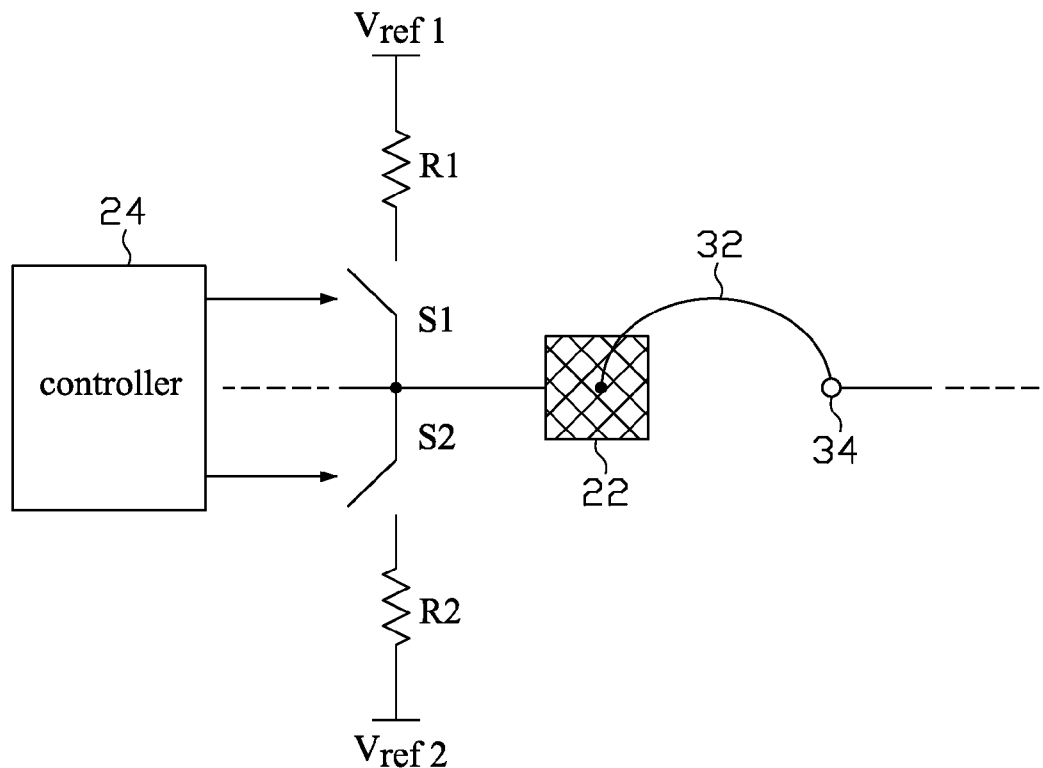

A testing procedure after the pad 22 is connected to an external voltage supply via a bonding wire is then discussed. As shown in FIG. 2B, the pad 22 receives an external voltage provided by an external voltage supply 34 via a bonding wire 32. For the circuit shown in FIG. 2B, the above first voltage V1 and the second voltage V2 may also be measured by respectively turning on and off the first switch S1 and the second switch S2.

When the controller 24 turns on the first switch S1 and turns off the second switch S2, supposing electrical connections between the pad 22, the bonding wire 32 and the external voltage supply 34 are functioning properly, the voltage of the pad 22 is approximately/substantially equaled to the external voltage whether the voltage provided by the external power supply 34 equals to the voltage of the power supply VDD, the voltage of ground GND or other voltage levels. In contrast, supposing the bonding wire 32 is disengaged or is in poor contact, the voltage of the pad 22 is approximately equal to the voltage of the power supply VDD regardless of the level of the external voltage.

When the controller 24 turns off the first switch S1 and turns on the second switch S2, supposing electrical connections between the pad 22, the bonding wire 32 and the external voltage supply 34 are functioning properly, the voltage of the pad 22 is approximately/substantially equaled to the external voltage whether the voltage provided by the external power supply 34 equals to the voltage of the power supply VDD, the voltage of ground GND or other voltage levels. In contrast, supposing the bonding wire 32 is disengaged or a poor contact of the bonding wire 32 occurs, the voltage of the pad 22 is approximately equaled to the voltage of ground GND regardless of the level of the external voltage.

Therefore, supposing electrical connections between the pad 22, the bonding wire 32 and the external voltage supply 34 are functioning properly, the first voltage V1 and the second voltage V2 are approximately equaled to the external voltage. Conversely, when an error condition is present, the first voltage V1 is approximately equaled to the voltage of the power supply VDD and the second voltage V2 is approximately equal to the voltage of ground GND. Hence, by comparing the first voltage V1 and the second voltage V2, it is determined whether an error condition is present in the connections between the pad 22, the bonding wire 32 and the external voltage supply 34. More specifically, when the first voltage V1 differs from the second voltage V2, the error condition is determined present.

Referring to a table in FIG. 3B, when no error condition is present and the external voltage is at a high level, the first voltage V1 and the second voltage V2 are both at a high level whether the first switch S1 or the second switch S2 is turned on. In contrast, when no error condition is present and the external voltage is at a low level, the first voltage V1 and the second voltage V2 are both at a low level whether the first switch S1 or the second switch S2 is turned on.

In the above embodiments, a measured target is the voltage of the pad 22. It is to be noted that, the testing point may be electrical terminals associated with the pad 22 inside or outside the integrated circuit chip. For example, supposing the integrated circuit chip comprises another output pin (not shown) that outputs different output signals as the voltage of the pad 22 changes, whether an error condition is present may also be determined according to the output signal of the output pin in this embodiment of the present invention. For example, the output signal is A when the voltage of the pad 22 is V1; whereas, the output signal is B when the voltage of the pad 22 is V2, and A differs from B. Also, take the test condition in FIG. 2B for example, it is determined that an error condition is present when the output signals of the output pin are different with the above two different connections.

In another embodiment, the integrated circuit chip comprises two input pins PE and PS (not shown). Voltages of the pins PE and PS are controlled by the controller 24, for indicating the turning on and off of the first switch S1 and the second switch S2. When the pin PE is at a high level, one of the first switch S1 and the second switch S2 is turned on while the other is turned off. When the pin PS is at a low level, the first switch S1 is turned off while the second switch S2 is turned on. When the pin PS is at a high level, the first switch S1 is turned on while the second switch S2 is turned off. In other words, in the testing procedure before the pad 22 is connected to the external voltage supply via the bonding wire 32, the controller 24 controls the PE to be at a high level and the pin PS to be at a low level, so as to turn off the first switch S1 and turn on the second switch S2 to measure the first voltage V1. Next, the controller 24 controls the pin PE to remain at a high level and changes the pin PS to a high level, so as to turn on the first switch S1 and turn off the second switch S2 to measure the second voltage V2. Under normal operating conditions of the pad 22, test results are as shown in FIG. 3A. In the testing procedure after the pad is connected to the external voltage supply via the bonding wire, the controller 24 similarly controls the pins PE and PS to measure the first voltage V1 and the second voltage V2. Under conditions that the bonding wire 32 is not disengaged and not in poor contact, test results are as shown in FIG. 3B.

When the test is completed and the integrated circuit chip is under a normal operating mode, the controller 24 turns off both the first switch S1 and the second switch S2, so that the pad 22 only receives the control voltage provided by the external power voltage supply 34 via the bonding wire 32. By adopting such connection, no leakage path is formed between the pad 22 and the power supply VDD or ground GND, so as to prevent fixed power consumption.

FIG. 4 shows a flowchart of a test method applied to the integrated circuit chip shown in FIGS. 2A and 2B. The method begins with Step S42 to measure a testing point associated with the pad 22 after turning on the first switch S1 and turning off the second switch S2 to generate a first test result. In Step S44, the testing point is again measured after turning on the second switch S2 and turning off the first switch S1 to generate a second test result. In Step S46, determining whether a connection error is present according to the first test result and the second test result. As to the example shown in FIG. 2B, an error condition is determined present when the first test result differs from the second test result.

It is to be noted that, a performing sequence of Steps S42 and S44 may be switched. Furthermore, the above testing point is not limited to the pad 22, and the pad 22 is not limited to a bonding option pad. In other words, the above test method is also applicable to various data input/output pads or power pads to determine whether connections with external circuits are correct.

With the above embodiments, it is illustrated that, by selectively connecting a pad to different reference voltages during a testing procedure and comparing corresponding test results, the integrated circuit chip and test method thereof of the present invention is capable of effectively determining whether electrical connections associated with the pad are functional. When the chip operates at a normal operating mode, no leakage path is formed between the pad and a power supply/ground, so as to overcome fixed power consumption in the prior art. Compared to the prior art, the test method and integrated circuit chip of the present invention are advantaged by having low-power consumption and being capable of effectively confirming whether a connection error is present.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit chip, comprising:
 a pad;
 a first resistor and a first switch, serially connected between the pad and a first reference voltage terminal;
 a second resistor and a second switch, serially connected between the pad and a second reference voltage terminal; and
 a controller selectively turning on and off the first switch and the second switch according to an error determining mechanism, the error determining mechanism being followed for determining whether an error condition associated with the pad is present;
 wherein, a voltage of the first reference voltage terminal is different from a voltage of the second reference voltage terminal.

2. The integrated circuit chip according to claim 1, wherein in following the error determining mechanism includes, a first test result obtained by measuring associated with the pad when the controller turns on the first switch and turns off the second switch, and a second test result obtained by measuring a voltage at the testing point when the controller turns on the second switch and turns off the first switch are referred to for determining whether the error condition is present.

3. The integrated circuit chip according to claim 2, wherein before the pad receives an external voltage via a bonding wire, the error condition is determined not present when the first test result indicates the pad and the first reference voltage terminal are equipotential and the second test result indicates the pad and the second reference voltage terminal are equipotential.

4. The integrated circuit chip according to claim 2, wherein when the pad receives an external voltage via a bonding wire, the error condition is determined present when the first test result differs from the second test result.

5. The integrated circuit chip according to claim 2, wherein the first reference voltage terminal is connected to a power supply and the second reference voltage terminal is connected to ground.

6. The integrated circuit chip according to claim 2, wherein the testing point is the pad.

7. The integrated circuit chip according to claim 2, wherein the first switch and the second switch respectively comprise a complementary metal oxide semiconductor (CMOS) transistor.

8. The integrated circuit chip according to claim 7, wherein the first resistor and the second resistor are respectively internal resistors in the CMOS transistors corresponding to the first switch and the second switch.

9. The integrated circuit chip according to claim 2, wherein the controller turns off the first switch and the second switch when the integrated circuit chip is at a normal operating mode.

10. A chip testing method, applied to an integrated circuit chip, the integrated circuit chip comprising a pad, a first resistor, a first switch, a second resistor and a second switch, the first resistor and the first switch being serially connected between the pad and a first reference voltage terminal, the second resistor and the second switch being serially connected between the pad and a second reference voltage terminal, a voltage of the second voltage terminal being different from a voltage of the first voltage terminal, the method comprising:

measuring a voltage at a testing point associated with the pad to generate a first test result after turning on the first switch and turning off the second switch;

measuring a voltage at the testing point to generate a second test result after turning on the second switch and turning off the first switch; and determining whether an error condition is present according to the first test result and the second test result.

11. The chip testing method according to claim 10, wherein before the pad receives an external voltage via a bonding wire, the error condition is determined not present when the first test result indicates the pad and the first reference voltage terminal are substantially equipotential and the second test result indicates the pad and the second reference voltage terminal are substantially equipotential.

12. The chip testing method according to claim 10, wherein after the pad receives an external voltage via a bonding wire, the error condition is determined present when the first test result differs from the second test result.

13. The chip testing method according to claim 10, wherein the first reference voltage terminal is connected to a power supply and the second reference voltage terminal is connected to ground.

14. The chip testing method according to claim 10, wherein the testing point is the pad.

15. The chip testing method according to claim 10, wherein the error condition is determined present when the first test result differs from the second test result.

16. The chip testing method according to claim 10, wherein the first switch and the second switch are turned off when the integrated circuit chip is at a normal operating mode.

* * * * *